United States Patent [19]
Lu et al.

[11] Patent Number: 6,084,794
[45] Date of Patent: Jul. 4, 2000

[54] HIGH SPEED FLAT-CELL MASK ROM STRUCTURE WITH SELECT LINES

[75] Inventors: Ding-Jou Lu; Jiann-Ming Shiau, both of Hsinchu, Taiwan

[73] Assignee: Winbond Electronics Corp., Taiwan

[21] Appl. No.: 09/321,852

[22] Filed: May 28, 1999

[51] Int. Cl.$^7$ .................................................. G11C 17/10
[52] U.S. Cl. .................... 365/104; 365/103; 365/230.04; 257/390
[58] Field of Search .................................... 365/103, 104, 365/230.03, 230.04; 257/390

[56] References Cited

U.S. PATENT DOCUMENTS 5,117,389   5/1992   Yiu ............................................ 365/104

*Primary Examiner*—Andrew Q. Tran
*Attorney, Agent, or Firm*—Finnegan, Henderson, Farabow, Garrett & Dunner, L.L.P.

[57] ABSTRACT

A flat-cell ROM array reduces the number of transistors utilized to read a memory cell, allows for the layout of straight metal lines, while sharing the metal lines between even and odd cells, and achieves very high density and high performance. Parallel buried diffusion regions are implanted in the substrate. A gate oxide is laid over the substrate. A plurality of polysilicon word lines are laid over the gate oxide perpendicular to the buried diffusion regions, so that the areas between respective pairs of buried diffusion regions and under the polysilicon word lines, form columns of flat cell field effect transistors. An insulating layer is laid over the polysilicon word lines and a plurality of metal bit lines and virtual ground lines are formed. These metal lines are shared by even and odd columns of field effect transistors. Access to metal lines is made through a plurality of block select transistors connected to every other buried diffusion bit line. The alternate buried diffusion bit lines are connected to every other buried diffusion region by odd and even select transistors.

13 Claims, 7 Drawing Sheets

CELL STRUCTURE

HIGH SPEED FLAT-CELL MASK ROM STRUCTURE WITH SELECT LINES

BACKGROUND OF THE INVENTION

1. Field of Invention

The present invention relates to Read-Only Memory (ROM) cell structures and, more particularly, to high density, high performance ROM cell structures.

2. Description of the Prior Art

Several ROM cell structures that read out cell data are well known in the art. One approach is referred to as the flat-cell ROM design. As with most integrated circuit design, speed, size, power and ease of fabrication, rank among the most important design considerations in the design. Improving speed while lowering power consumption and minimizing size are goals of most integrated circuit design. Furthermore, it is desirable to simplify design to allow for easier fabrication techniques which in turn will decrease the cost of manufacture.

One method of optimizing ROM cell structure performance in terms of speed, size, power consumption and ease of design, is to limit the number of transistors used in a particular circuit. Additionally, optimal use of semiconductor surface area will provide semiconductor devices smaller in size and easier to fabricate. The flat cell design gives a very small area per storage unit cell (ROM cell) compared to other known design approaches.

In a flat-cell field-effect transistor (FET), unlike the traditional Local Oxidation Silicon (LOCOS) approach to FET design, the width of the polysilicon word line defines the channel width of the FET, rather than the channel length. This allows a designer to pack the polysilicon lines in the ROM cores purely from the point of view process limitations, rather than the FET device's physical limitations. Also, because there is no thermally grown field oxide in the core ROM cell region, there is no channel width reduction due to birdsbeak in the field oxide. This allows a very dense core array to be achieved.

However, the size of the ROM cell does not alone determine the size of the ROM array. The circuitry required to access the ROM cell and other peripheral circuits also contributes to the overall size of the array. Therefore, limiting the number of transistors required in the circuitry for accessing the ROM can optimize speed, size and power consumption.

Also, in a flat-cell ROM, the local bit lines are fabricated with buried diffusion, and have relatively high resistance and capacitance associated with them. Thus, it is difficult to drive the buried diffusion lines quickly. In order to overcome the speed problem with the buried diffusion bit lines, metal lines running parallel with the buried diffusion lines, and making contacts with them every so often, are used in the prior art. However, the core ROM cell pitch becomes limited by the metal and contact pitches, rather than the basic transistor pitches, and loses packing advantages.

A prior art flat-cell ROM design can be found in U.S. Pat. No. 5,117,389 of Yiu, entitled "Flat-Cell Read-Only-Memory Integrated Circuit." In the Yiu reference the flat-cell ROM array uses block select transistors to allow for the layout of straight metal lines. The circuit design of Yiu is shown in FIG. 1 which corresponds to FIG. 4 of Yiu. The circuitry required to access the ROM cell of Yiu utilizes a minimum of 4 transistors. FIG. 1 shows the integrated circuit of Yiu requires a block select transistor ($BWL_N$), word select transistor ($SWL_N$), bank left select transistor ($SBL_N$), and a bank right select transistor ($SBR_N$) to access a ROM cell. One disadvantage of the ROM design of Yiu is in the number of transistors required to access the ROM cell, which affects the overall size of the array. Other peripheral circuits also contribute to the overall array size.

FIG. 2 also shows a ROM cell array found in Japanese patent application no. 6375300. The integrated circuit of FIG. 2 requires the use of a minimum of 3 transistors to access information found in the ROM sub-array. However, the integrated circuit of FIG. 2 suffers from several disadvantages. For example, the resistance of the read path of the circuit of FIG. 2 from the sense amplifier through the cell selector and cell transistors to ground is not fixed. If, for example, it is desired to read an odd cell on word line WL0, the signal must travel the additional length that extends to transistor $SO_j$. In contrast, if it is desired to read an odd cell on word line WL15, the signal travels a much shorter length to transistor $SO_j$. Thus the signal path resistance when reading the cell on WL15 is much less than the resistance when reading the cell on WL0. Since the signal path resistance affects the data access time (RC delay), the data access time in this structure is not fixed. Further, the layout of the cell loses packing advantages. As a result, the buried N+resistance could become too large. Additionally, the layout does not allow for straight metal bit lines. The zig-zag metal bit lines (6, 7) of FIG. 2 cause metal bit lines of a smaller pitch in the regions where the lines jog. This complicates the manufacturing process.

Therefore, it is desirable to design a high performance ROM, while maintaining high packing densities offered by the flat-cell design technique, which can be manufactured with high yield. It is also desirable to utilize straight metal bit lines to simplify manufacture and increase circuit efficiency. It is also desirable to minimize the number of transistors in an array in order to optimize speed, size, power consumption and ease of fabrication parameters.

SUMMARY OF THE INVENTION

Additional aspects and advantages of the invention will be set forth in part in the description which follows, and in part will be obvious from the description, or may be learned by practice of the invention. To achieve the objects and in accordance with the purpose of the invention, as embodied and broadly described herein, the invention comprises of the invention can be seen upon review of the figures, the detailed description, and the claims which follows.

The present invention provides a flat-cell ROM array which includes a plurality of sub-arrays which each utilizes a plurality of diffusion regions in a substrate, an insulating layer, block select transistors, conductive bit lines which provide contact through the insulating layer, a plurality of word lines, storage cells, conductive cell select lines and a block select line to overcome many of the problems of the prior art. Also provided in the invention is a method of using the flat-cell ROM array to access information in a quick and efficient manner.

It is to be understood that both the foregoing general description and the following detailed description are exemplary and explanatory only and are not restrictive of the invention, as claimed.

The accompanying drawings, which are incorporated in and constitute a part of this specification, illustrate the embodiments of the invention and together with the description serve to explain the principles of the invention.

DETAILED DESCRIPTION OF THE PREFERRED EMBODIMENTS

Reference will now be made in detail to the present preferred embodiments of the invention, an example of which is illustrated in the accompanying drawings. Wherever possible, the same reference numbers or characters will be used throughout the drawings to refer to the same or like parts.

The present invention provides a novel ROM array scheme using flat-cell technology to achieve very high density. The ROM array is divided into sub-arrays. The sub-arrays of flat cells are selected by fully decoded block select lines through block select transistors. The novel sub-array configuration allows for reading selected cells of the sub-array with fewer transistors. This ultimately leads to smaller, more efficient, faster ROM arrays. Use of the local buried diffusion bit lines together with the flat-cell transistors achieves shared metal bit line access with straight metal lines, and compact layout. Overall, the improved, high density, high performance and high yield ROM integrated circuit according to the invention requires fewer transistors to read selected data.

Figure 1:
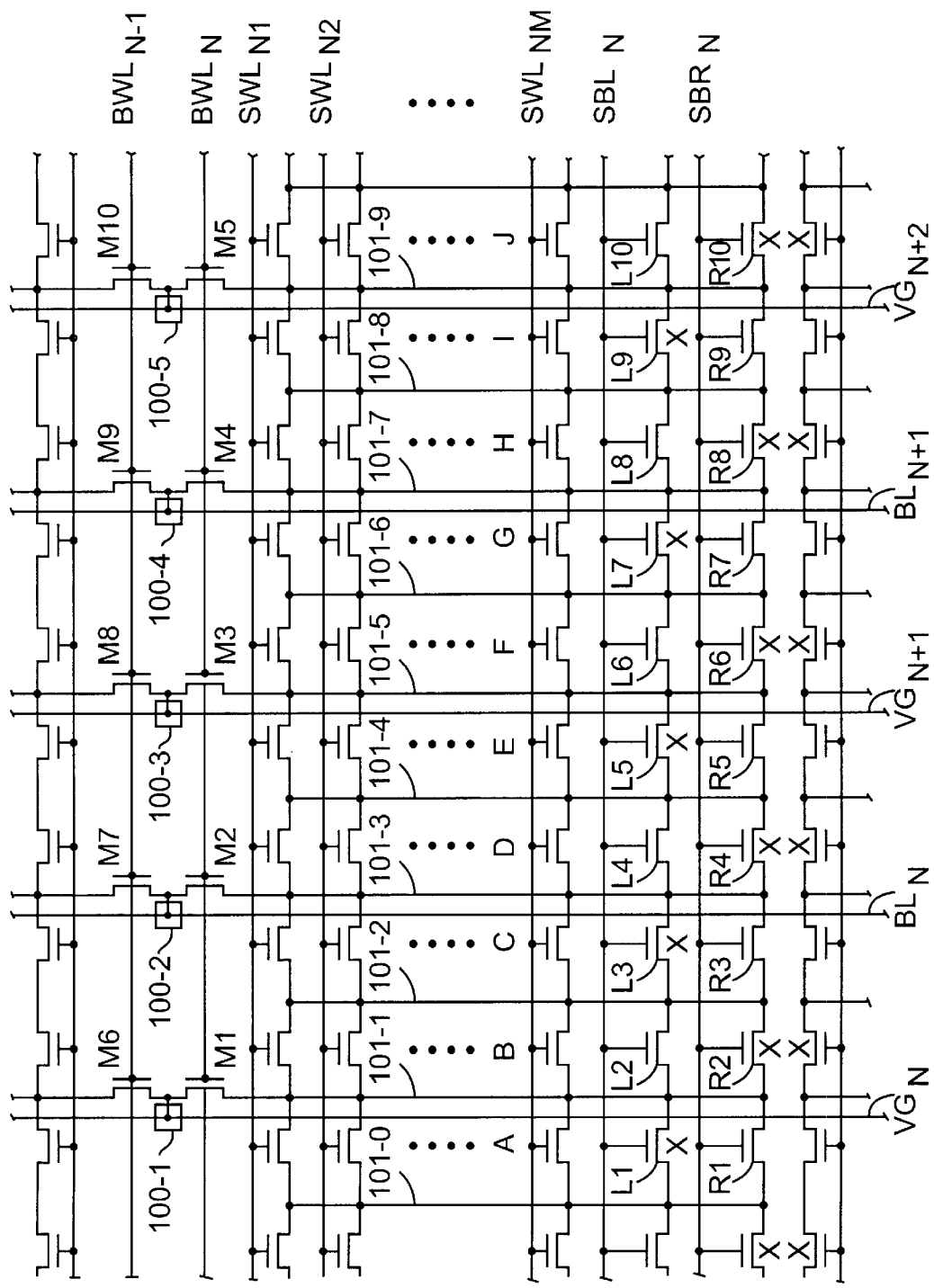
FIG. 1 is a schematic top view of the layout of a prior art flat-cell ROM core.
Figure 2:
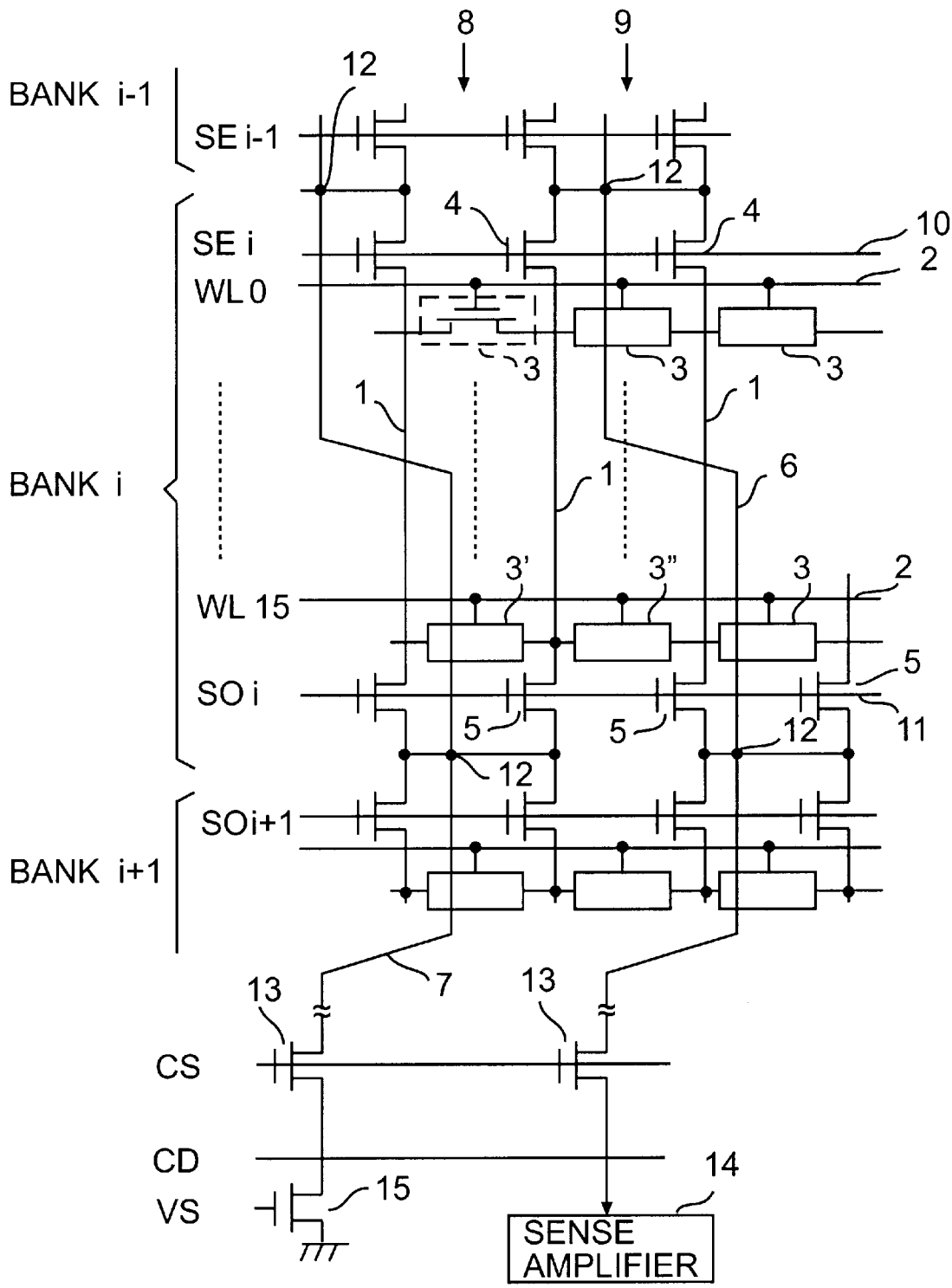
FIG. 2 is a schematic top view of the layout of a prior art flat-cell ROM core.
Figure 3:
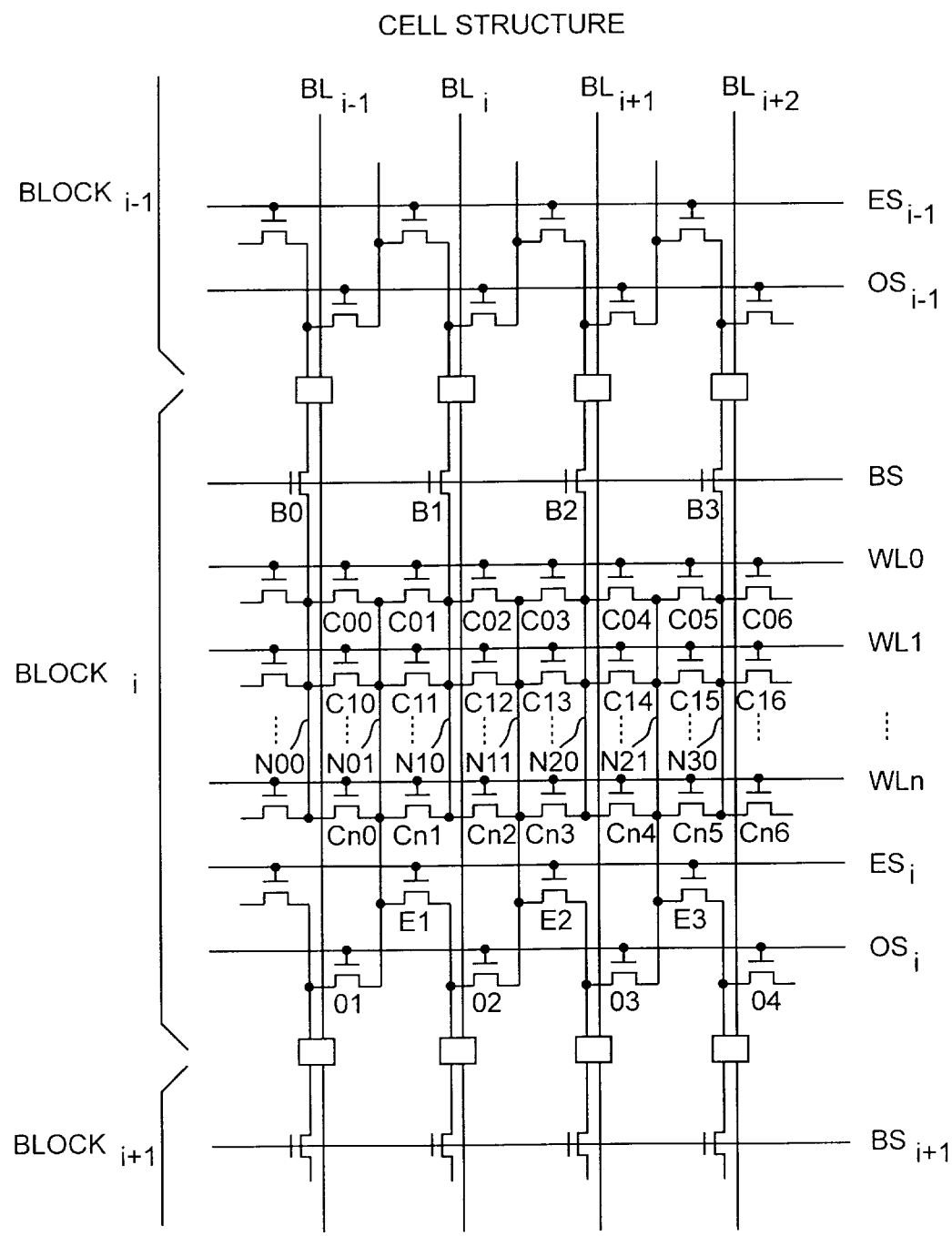
FIG. 3 is a schematic of the structure of a ROM core structure consistent with the present invention.

FIG. 3 is a schematic circuit diagram of a ROM array circuit according to one embodiment of the present invention. The array includes ROM sub-array blocks (I,I+1, and I-1). ROM sub-array "BLOCK I" is further shown in operation of selecting the even cells and odd cells illustrated in FIGS. 5 and 6, respectively. The sub-array architecture consistent with the present invention is described, for convenience and without limitation, using an index notation for a sub-array having "2k" local bit lines as follows: "k" denotes the number of desired global metal data lines; "n" denotes the number of word lines desired and "I" denotes the number of sub-arrays desired within a ROM array circuit.

In FIG. 3, the sub-array block designated "BLOCK i" includes a plurality of block select transistors (B0–B(k-1)). The block select transistors are preferably implemented as FETs and have good isolation from other components in the integrated circuit and, therefore, low capacitive loading and high switching speeds. Each sub-array block shown in FIG. 3 includes a block select line ($BS_i$, $BS_{i+1}$ and $BS_{i-1}$ (not shown)) for selecting the appropriate block to read, as well as block select transistors. Each block select transistor includes buried N+ regions for source and drain and is coupled to a metal-to-diffusion contact at its drain. For example, the drains of block select transistors B0–B3 are connected to global metal lines $BL_0$–$BL_3$, respectively (shown in FIG. 4a). The gate of each block select transistor is connected to the associated block select line. For example the gates of block select transistors B0–B3 of Block i are connected to block select line $BS_i$. The source of each block select transistor is coupled to a buried diffusion bit line. For example, the sources of block select transistors B0–B3 of Block i are connected to buried diffusion lines N00, N10, N20 and N(3,0). Thus, generally the source of block select transistors B(k-1) is connected to line N(k-1,0). Three global metal bit lines are respectively coupled to Vss, a sense amplifier, and VBL, in accordance with a read operation described more fully below. Global metal bit lines not in use for the read operation of a particular cell are left floating (i.e. connected to nothing). It should be noted that the metal global bit line connected to VBL may also be left floating, at the cost of operating speed, since leaving that global bit line floating as opposed to connected to VBL will require more time to correctly sense data.

The ROM cell sub-array further includes 2k of the buried diffusion bit lines (N00, N01, N10, N11 . . . N(k-1,0),N(k-1,1)) noted above that are connected to the block select transistors. Polysilicon word lines WL0–$WL_n$ are formed perpendicular to the 2k buried diffusion bit lines. In this manner, a ROM array is defined such that the buried diffusion bit lines serve as the source of a first column of ROM cells and the drain of the second column of ROM cells. The k, odd numbered buried diffusion bit lines (N01, N11, N21, N31 . . . N(k-1,1)) are coupled to respective drains of the even numbered cell select transistors, e.g., to transistors E1, E2, and E3, and to the sources of odd numbered cell select transistors, e.g., to transistors O1, O2, and O3. The drain of each odd cell select transistor is connected to the source of the even cell select transistor of the prior column of the ROM cell. For example, the drain of transistor O3 is connected to the source of transistor E2. The gate of each even cell select transistor is coupled via metal-to-diffusion contact to an even select line ($ES_{I-1}$, $ES_I$ and $ES_{I+1}$ (not shown)) for the associated block. Likewise the gate of each odd select transistors is coupled via metal-to-diffusion contact to an odd select line ($OS_{I-1}$, $OS_I$, and $OS_{I+1}$ (not shown)) for the associated block.

The odd numbered buried diffusion bit lines (N01, N11, N21, N31 . . . N(k-1,1)) are connected through odd select transistors O1, O2, O3 . . . Ok to global metal data lines via metal to diffusion contacts. The even numbered buried diffusion bit lines (N00, N10, N20, N30 . . . N(k-1,0)) are connected through block select transistors B0, B1, B2 . . . B(k-1) to the same global metal data lines via metal-to-diffusion contacts. Thus, two core cell pitches are allocated for each metal line pitch.

Figure 4A:
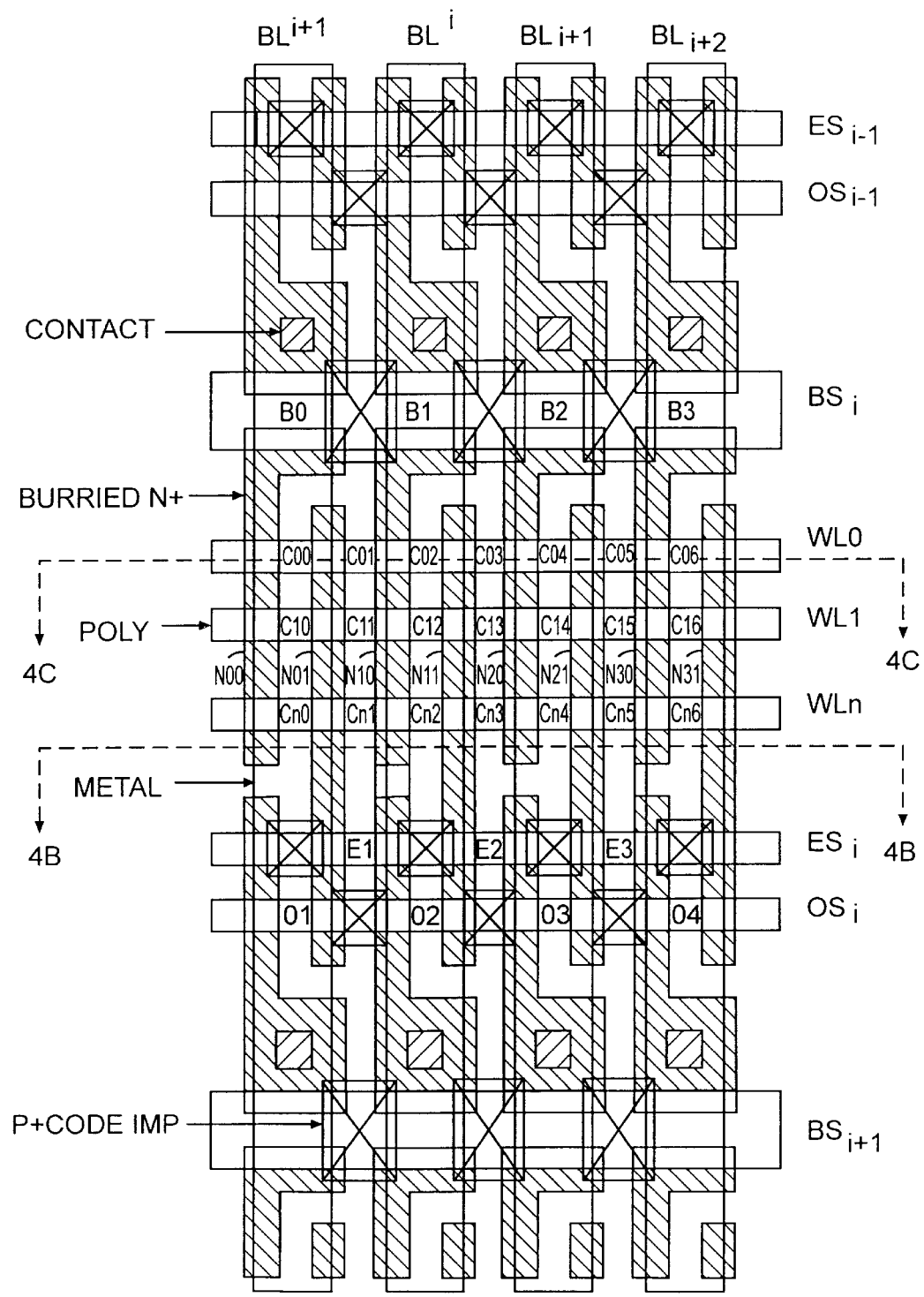
FIG. 4a is a mask to fabricate a flat-cell ROM core structure consistent with the present invention.

FIG. 4a illustrates the ROM cell array layout mask according to the embodiment of the present invention shown in FIG. 3. The regions C00, C01, C10, C11 . . . C(n,k) are the gate/channel regions of respective flat-cell transistors which store data, and form the ROM cells storage unit and are hereafter referred to as cells. In order to store 1 or 0 in each of the transistors, the mask ROM technique is used to lay down low enhancement or high enhancement type channels, respectively. Manufacturing techniques used with the layout mask of FIG. 4a include the implantation of buried diffusion lines in the silicon substrate. A thin gate oxide is formed, e.g., by thermal oxidation or deposition, over the silicon substrate to form an insulation layer. Then polysilicon and metal lines are formed over the gate oxide to form field effect transistors. An insulating layer (not shown) of substantially constant thickness is formed over the entire section of substrate. The insulating layer allows global metal bit lines to be formed in straight lines over the entire structure without concern for inadvertent contact. As can be seen in FIG. 4a, the global metal bit lines ($BL_{i-1}$, $BL_i$, $BL_{i+1}$, $BL_{i+2}$), and polysilicon word lines ($WL0$–$WL_n$) are formed on the silicon substrate in straight lines. FIG. 4a shows, for example, four global metal bit lines ($BL_{i-1}$, $BL_i$, $BL_{i+1}$, $BL_{i+2}$) are shared by eight local, buried diffusion bit lines (N00–N40). Even and odd select lines (ES and OS) are additionally shown to be formed on the silicon substrate in straight lines. The width of these polysilicon select lines is adjustable, not fixed, to conform with particular design specifications. Narrower polysilicon select lines will conserve area and therefore create a smaller device, while wider polysilicon select lines will enable the device to operate faster. Also, the channel length in the cell transistors is defined by the width of the polysilicon word lines WL. The layout shown in the FIG. 4a is representative, and can be altered to suit the particular manufacturing process to be used. FIG. 4a also shows p+ code implantations (depicted as crossed squares) which isolate adjacent block select transistors from one another.

Figure 4B:
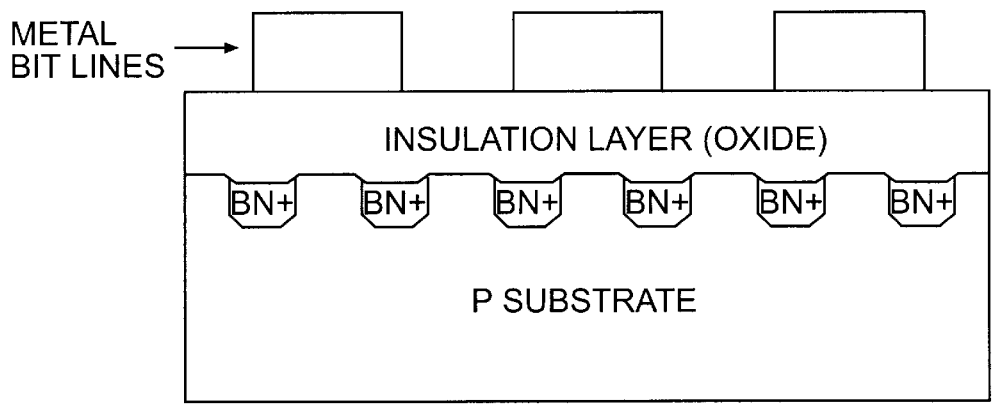
FIG. 4b is a cross sectional view of the structure along line 4B—4B consistent with the present invention.
Figure 4C:
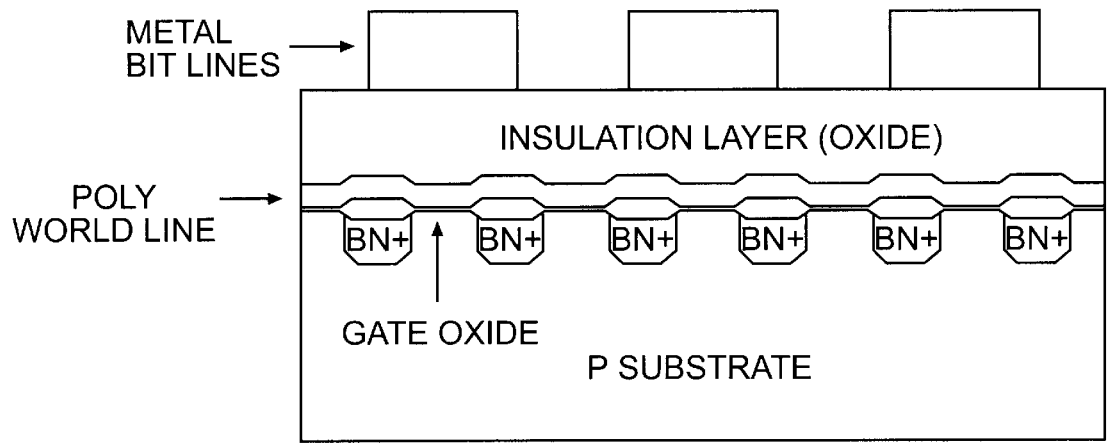
FIG. 4c is a cross sectional view of the structure along line 4C—4C consistent with the present invention.

FIGS. 4b and 4c illustrate cross sectional views of the device of FIG. 4a along section lines 4B—4B and 4C—4C. FIG. 4b illustrates the relationship of the diffusion bit lines buried in the p-type substrate, the global metal bit lines and the insulation layer there between. FIG. 4c illustrates the additional relationship of the diffusion bit lines buried in the p-type substrate with the polysilicon word lines and gate oxide layer to form FETs.

Figure 5:
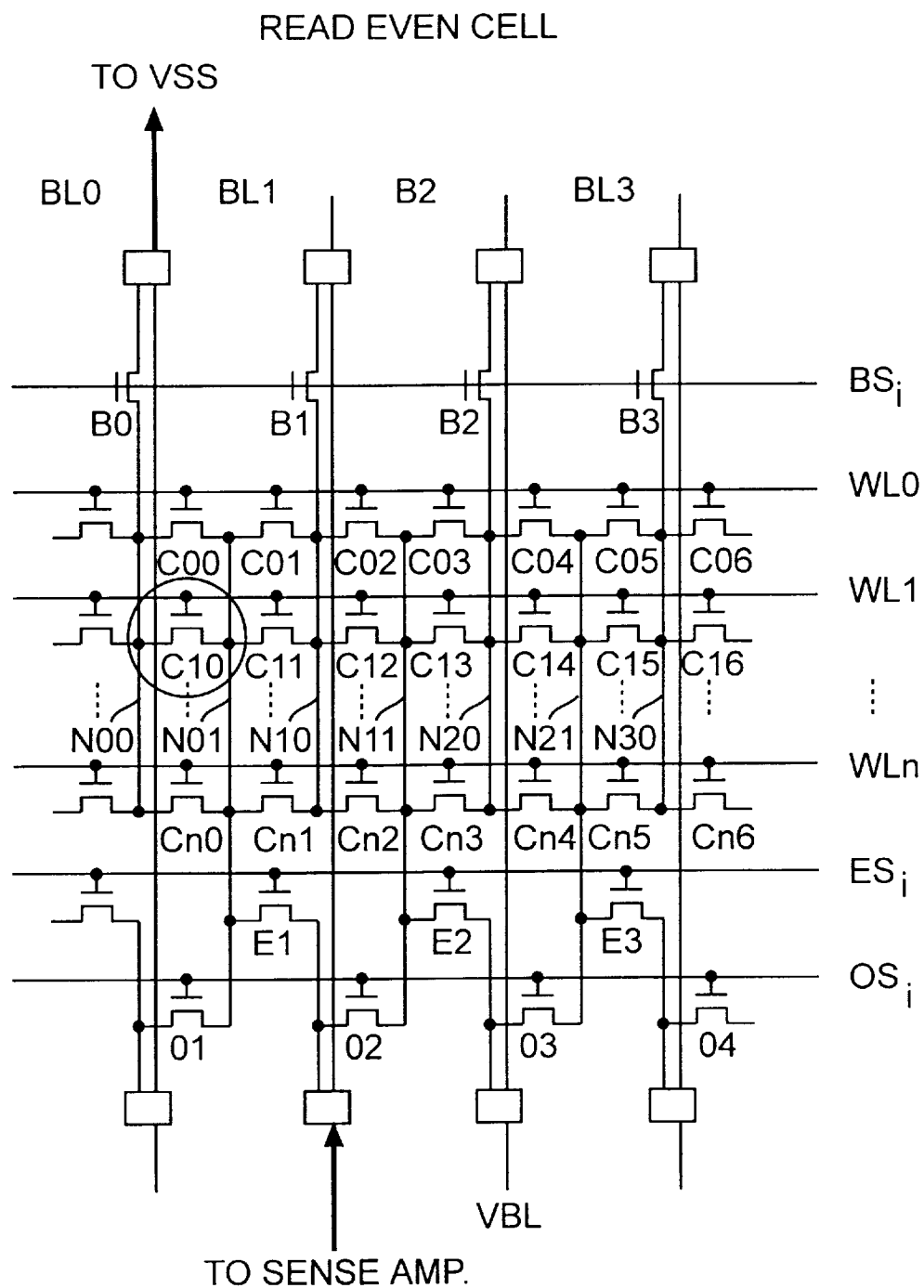
FIG. 5 is a circuit diagram of a ROM sub-array consistent with the present invention showing the conditions necessary to sample an even cell.
Figure 6:
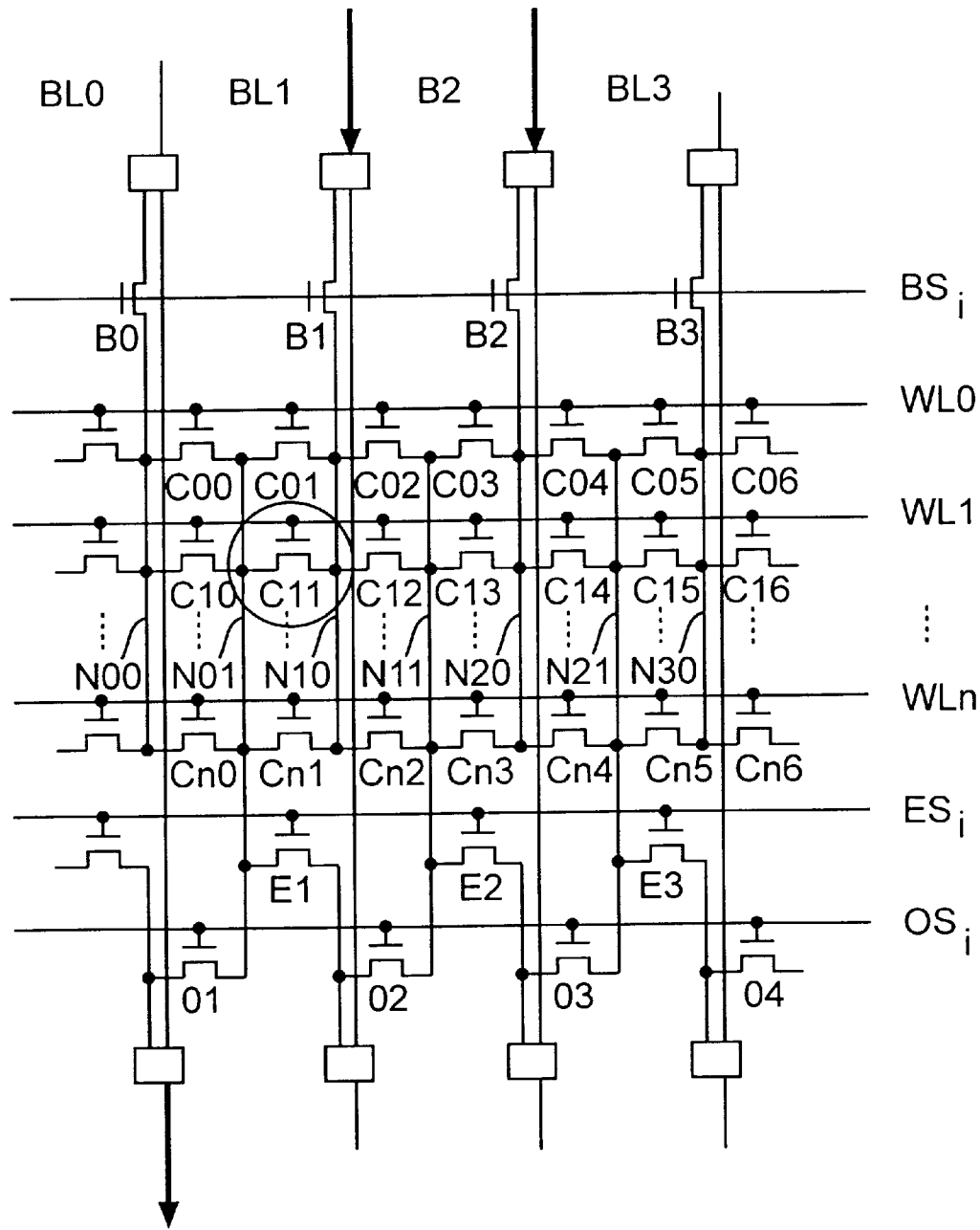
FIG. 6 is a circuit diagram of a ROM sub-array consistent with the present invention showing the conditions necessary to sample an odd cell.

FIGS. 5 and 6 illustrate the operation of one embodiment of the present invention. FIG. 5 illustrates the manner in which an embodiment of the present invention reads data from an even cell. FIG. 6 illustrates the manner in which an embodiment of the present invention reads data from an odd cell.

FIG. 5 shows even cell columns as those columns of cells including cells C00, C02, C04 . . . C(n,k) (for k being an even number). The conditions for an even cell read operation are shown in FIG. 5. BS is the signal to select the block, and ES or OS is the signal to select the even or odd cell of the two cells between neighboring bit lines. Signals BS, ES, and OS must be set low when their corresponding block is not selected. For the cell being selected, the bit lines on its two sides should be connected to Vss on one side and to the sense amplifier on the other side. The bit line next to the bit line connected to the sense amplifier (but not the bit line connected to Vss) should be connected to VBL. VBL is a reference voltage with the same voltage level as the sense amplifier. Connecting this bit line to VBL prevents interference on the sense amplifier by displacement currents from other cells. For the sake of decoder circuit simplicity, for an even cell read operation the bit line on the left can always be connected to Vss, the bit line on the right always connected to the sense amplifier and the bit line further to the right connected to VBL. The remaining bit lines are left floating. Additionally it is possible to operate the circuit with the bit line next to the bit line connected to the sense amplifier (but not the bit line connected to Vss)left floating. However, the circuit operating in this manner will require additional time to correctly sense the data. The operation of the even cell read will be illustrated by an example.

In the example, cell C10 is to be selected. In order to select cell C10, the appropriate block must be selected which in this case is block "I". The block select line $BS_i$, the even select line $ES_i$, and the word line WL1 are all pulled high in order to activate the related transistors B0, and E1 and cell C10. The odd select line $OS_i$ is pulled low in order to deactivate the transistor O1. Bit line BL0 is connected to Vss, bit line BL1 to a sense amplifier (not shown) and bit line BL2 to VBL. The current from the sense amplifier flows through even bit select transistor E1, cell C10, and then block select transistor B0 to Vss. The buried n+ diffusion lines N01 and N10 are connected to bit line BL1 through transistors E1 and B1, respectively, thus cell C11 has no effect since its drain and source are at the same voltage level. Bit line BL2 is connected to VBL, which has the same voltage as the sense amplifier. The buried diffusion lines N11 and N20 are connected to bit line BL2 through transistors E2 and B2, respectively, thus cells C12 and C13 will have no effect either. The displacement current from cells to the right of buried diffusion line N20 (namely cells C14, C24, C34, . . . Cn4, C15, . . . C16 . . . Cnk) will flow to VBL instead of to the sense amplifier, thus these cells will also have no effect. Likewise, the displacement current from cells to the left of buried diffusion line N00 will flow into Vss rather than the sense amplifier and thus have no effect. Therefore the cell C10 determines the result detected by the sense amplifier.

An odd cell read operation is similar to the even cell read operation. FIG. 6 shows odd cell columns as those columns of cells including cells C01, C03, C05 . . . C(n,k) (for k being an odd number). The odd cell read conditions are shown in the block in FIG. 6. BS is the signal to select the block, and ES or OS is the signal to select the even or odd cell of the two cells between neighboring bit lines. Signals BS, ES, and OS must be set to low when their corresponding block is not selected. For the cell being selected, the bit lines on its two sides should be connected to Vss on one side and to the sense amplifier on the other side. The bit line next to the bit line connected to the sense amplifier (but not the bit line connected to Vss) should be connected to VBL. As in the case of the even cell read operation, connecting to VBL prevents interference on the sense amplifier by displacement currents from other cells. For the sake of decoder circuit simplicity, for an odd cell read operation the bit line on the left can always be connected to Vss, the bit line on the right always connected to the sense amplifier and the bit line further to the right connected to VBL. The remaining bit lines are left floating. Additionally it is possible to operate the circuit with the bit line next to the bit line connected to the sense amplifier (but not the bit line connected to Vss)left floating. However, the circuit operating in this manner will require additional time to correctly sense the data. The operation of the odd cell read will be illustrated by an example.

In the example, cell C11 is to be selected. In order to select cell C11, the appropriate block must be selected which in this case is block "I". The block select line $BS_i$, the odd select line $OS_i$, and the word line WL1 are all pulled high in order activate the related transistors B0, C11 and O1. Even select line $ES_i$ is pulled low to deactivate the even select transistor E1. Bit line BL0 is connected to Vss, bit line BL1 to a sense amplifier (not shown) and bit line BL2 to VBL. The current from the sense amplifier flows through block select transistor B1, cell C11, and then odd bit select transistor O1 to Vss. The buried n+ diffusion lines N00 and N01 are both connected to bit line BL0 through transistors B0 and O1, respectively, thus the cell C10 has no effect since its drain and source are at the same voltage level. Bit line BL2 is connected to VBL, which has the same voltage as the sense amplifier at BL1. The buried diffusion lines N10 and N11 are connected to bit line BL1 through transistors B1 and O2, respectively, thus cell C12 has no effect since its drain and source are at the same voltage level. Buried diffusion bit line N20 is connected to VBL through transistor B2. As the voltage level at buried diffusion bit line N11 is connected to the sense amplifier at bit line BL1, the voltages at the drain and source of cell C13 are the same. Thus cell C13 will have no effect. The displacement current from cells to the right of node N20 (namely C14, C24, C34, . . . Cn4, C15 . . . C16 . . . Cnk) will flow to VBL instead of to the sense amplifier, thus these cells will also have no effect. Likewise, the displacement current from cells to the left of buried diffusion bit line N00 will flow into Vss rather than the sense amplifier and thus have no effect. Therefore the cell C11 determines the result detected by the sense amplifier.

The foregoing description of the preferred embodiments of the present invention has been provided for the purpose of illustration and description. It is not intended to be exhaustive or to limit the invention to the precise forms disclosed. Obviously many modifications, variations and simple derivations will now become apparent to practitioners skilled in the art. For example, the cell gate regions may constructed with n-diffusion material and thus reverse the polarity of the voltage sources. The embodiments were chosen and described in order to best explain the principles of the invention and its practical application, thereby enabling others skilled in the art to understand the invention for various embodiments and with various modifications are suited to the particular use contemplated. It is intended that the scope of the invention be defined by the following claims and their equivalents.

What is claimed is:

1. A memory circuit on a semiconductor substrate, comprising:
   a flat cell ROM array including a plurality of sub-arrays, each sub-array including
      a plurality of first buried diffusion regions in the substrate, the regions forming odd and even diffusion lines in a section of the substrate;
      an insulating layer of substantially constant thickness over the section of the substrate;
      a plurality of block select transistors formed on the substrate;
      a plurality of conductive bit lines each coupled to a source of a different one of the block select transistors via a metal-to-diffusion region contact through the insulating layer;
      a plurality of word lines over the insulating layer and intersecting the first buried diffusion regions;
      a plurality of storage cells each including a storage cell field effect transistor having a channel in a region between a pair of the first buried diffusion regions and under one of the word lines, whereby a column of storage cells is formed between each pair of first buried diffusion regions and under the plurality of word lines;
      a plurality of second buried diffusion regions in the substrate, the plurality of second diffusion regions respectively corresponding to said even diffusion lines, wherein the plurality of second buried diffusion regions are respectively coupled, by means of a metal-to-diffusion region contact, to said conductive bit lines;
      a pair of conductive cell select lines over the insulating layer, the pair of conductive cell select lines intersecting the odd diffusion lines and said plurality of second buried diffusion regions, so that a region between each of said plurality of second buried diffusion regions and an adjacent one of said odd diffusion lines and under one of the conductive cell select lines, forms a channel of a cell select field effect transistor; and
      a conductive block select line over the insulating layer and coupled to a gate of each of the plurality of block select transistors, drains of said plurality of block select transistors being respectively coupled to said even diffusion lines, sources of said plurality of block select transistors being respectively coupled to a plurality of second diffusion regions of a preceding one of said plurality of sub-arrays.

2. The memory circuit of claim 1 wherein the plurality of word lines comprise polysilicon.

3. The memory circuit of claim 1 wherein the conductive bit lines comprise metal.

4. The memory circuit of claim 1 wherein the cell select field effect transistors are coupled in series.

5. The memory circuit of claim 4 wherein the pair of conductive cell select lines comprises an even and an odd cell select line, wherein gates of said cell select transistors are respectively and alternately coupled to said even and odd cell select lines.

6. The method of reading a cell of a sub-array block of a memory circuit, comprising:
   providing a flat-cell ROM array memory circuit;
      wherein the flat-cell ROM array memory circuit, comprises
      a flat cell ROM array including a plurality of sub-arrays, each sub-array including
         a plurality of first buried diffusion regions in a substrate, the regions forming odd and even diffusion lines in a section of the substrate;
         an insulating layer of substantially constant thickness over the section of the substrate;
         a plurality of block select transistors formed on the substrate;
         a plurality of conductive bit lines each coupled to a source of a different one of the block select transistors via a metal-to-diffusion region contact through the insulating layer;
         a plurality of word lines over the insulating layer and intersecting the first buried diffusion regions;
      a plurality of storage cells each including a storage cell field effect transistor having a channel in a region between a pair of the first buried diffusion regions and under one of the word lines, whereby a column of storage cells is formed between each pair of first buried diffusion regions and under the plurality of word lines;
         a plurality of second buried diffusion regions in the substrate, the plurality of second diffusion regions respectively corresponding to said even diffusion lines, wherein the plurality of second buried diffusion regions are respectively coupled, by means of a metal-to-diffusion region contact, to said conductive bit lines;
         a pair of conductive cell select lines over the insulating layer, the pair of conductive cell select lines intersecting the odd diffusion lines and said plurality of second buried diffusion regions, so that a region between each of said plurality of second buried diffusion regions and an adjacent one of said odd diffusion lines and under one of the conductive cell select lines, forms a channel of a cell select field effect transistor; wherein said pair of conductive cell select lines constitute a first and second cell select line, alternate ones of said plurality of storage cells being respectively associated with said first or second cell select line; and
         a conductive block select line over the insulating layer and coupled to a gate of each of the plurality of block select transistors, drains of said plurality of block select transistors being respectively coupled to said even diffusion lines, sources of said plurality of block select transistors being respectively coupled to a plurality of second diffusion regions of a preceding one of said plurality of sub-arrays;

connecting said block select line to a first logic level;

connecting a selected one of said plurality of word lines to the first logic level when a storage cell to be selected is connected to said selected word line and non-selected ones of said plurality of word lines being connected to a second logic level; and connecting first and second cell select transistors to the first and second logic levels, respectively, when the selected storage cell is associated with the first or second cell select line.

7. The method of reading a cell of claim 6 further comprising connecting a one of the conductive bit lines on one side of the selected cell to a power-bus line.

8. The method of reading a cell of claim 7 further comprising connecting a one of the conductive bit lines on the other side of the selected cell to a sense amplifier.

9. The method of reading a cell of claim 8 further comprising connecting to a VBL potential a one of the conductive bit lines adjacent to and on a side of the bit line connected to the sense amplifier remote from the bit line connected to the power-bus line.

10. The method of reading a cell of claim 9 further comprising setting the VBL potential to substantially the same potential as provided by the sense amplifier.

11. The method of reading a cell of claim 7 further comprising connecting the power-bus line to a Vdd potential.

12. The method of reading a cell of claim 7 further comprising connecting the power-bus line to a Vss potential.

13. The method of reading a cell of claim 6, wherein first, second, and third ones of the plurality of conductive bit lines are arranged in a left-to-right order, said method further comprising:

connecting the first conductive bit line to a power-bus line;

connecting the second conductive bit line to a sense amplifier; and connecting the third conductive bit line to a VBL potential.

* * * * *